(12) United States Patent
Chen et al.

(10) Patent No.: US 12,356,071 B2
(45) Date of Patent: Jul. 8, 2025

(54) OPTICAL ELEMENT DRIVING MECHANISM

(71) Applicant: TDK TAIWAN CORP., Taoyuan (TW)

(72) Inventors: Shu-Shan Chen, Taoyuan (TW); Chao-Chang Hu, Taoyuan (TW); Chih-Wei Weng, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 785 days.

(21) Appl. No.: 17/553,126

(22) Filed: Dec. 16, 2021

(65) Prior Publication Data

US 2022/0196974 A1 Jun. 23, 2022

Related U.S. Application Data

(60) Provisional application No. 63/127,746, filed on Dec. 18, 2020.

(51) Int. Cl.
| | |
|---|---|
| *H04N 23/68* | (2023.01) |
| *G02B 7/04* | (2021.01) |
| *G02B 7/09* | (2021.01) |
| *G02B 13/00* | (2006.01) |
| *G02B 26/00* | (2006.01) |
| *G02B 26/08* | (2006.01) |
| *G02B 27/64* | (2006.01) |
| *G06F 3/01* | (2006.01) |
| *H04N 23/54* | (2023.01) |
| *H04N 23/57* | (2023.01) |

(Continued)

(52) U.S. Cl.
CPC ............. *H04N 23/687* (2023.01); *G02B 7/04* (2013.01); *G02B 7/09* (2013.01); *G02B 13/0015* (2013.01); *G02B 26/00* (2013.01); *G02B 26/0875* (2013.01); *G02B 27/64* (2013.01); *G02B 27/646* (2013.01); *G06F 3/016* (2013.01); *H04N 23/54* (2023.01); *H04N 23/57* (2023.01); *H10N 30/101* (2024.05); *H10N 30/802* (2023.02)

(58) Field of Classification Search
CPC .... G02B 26/00; G02B 26/0875; G02B 27/64; G02B 27/646; G02B 7/04; G02B 7/09; G06F 3/016; H04N 23/54; H04N 23/57; H04N 23/687; H10N 30/101; H10N 30/802
See application file for complete search history.

(56) References Cited

U.S. PATENT DOCUMENTS

2020/0142161 A1* 5/2020 Jun .................... G02B 7/102
2021/0063680 A1* 3/2021 Kim .................... G03B 13/36
(Continued)

*Primary Examiner* — Amy R Hsu
(74) *Attorney, Agent, or Firm* — Muncy, Geissler, Olds & Lowe, P.C.

(57) ABSTRACT

An optical element driving mechanism is provided, including a first movable part, a second movable part, and a third movable part. The first movable part is connected to a first optical element. The second movable part is connected to a second optical element that has an optical axis. The third movable part is connected to a third optical element. The first optical element, the second optical element, and the third optical element are arranged along the optical axis. The second optical element is located between the first optical element and the third optical element when viewed along a direction that is perpendicular to the optical axis.

19 Claims, 7 Drawing Sheets

(51) Int. Cl.
  *H10N 30/00* (2023.01)
  *H10N 30/80* (2023.01)

(56) References Cited

U.S. PATENT DOCUMENTS

2023/0042087 A1* 2/2023 Uno .................. G02B 7/08
2024/0159987 A1* 5/2024 Yuri .................. G02B 7/09

* cited by examiner

OPTICAL ELEMENT DRIVING MECHANISM

CROSS REFERENCE TO RELATED APPLICATIONS

This application claims the benefit of U.S. Provisional Application No. 63/127,746 filed 18 Dec. 2020, the entirety of which is incorporated by reference herein.

BACKGROUND OF THE INVENTION

Field of the Invention

The present disclosure relates to an optical element driving mechanism, and more particularly to an optical element driving mechanism of an electrical device.

Description of the Related Art

As the relevant technologies have developed, many electronic devices (such as computers and tablets) are equipped with the capability to record images and videos. However, when an optical element (such as lens) having a long focal length is provided in an electronic device, the thickness of the electronic device may be increased, impeding the prospects for miniaturization of the electronic device. Therefore, how to design an optical element driving mechanism and an optical device that help to miniaturize the electronic device has become an important issue.

BRIEF SUMMARY OF THE INVENTION

To solve the problems of the prior art, an optical element driving mechanism, including a first movable part, a second movable part, and a third movable part. The first movable part is connected to a first optical element. The second movable part is connected to a second optical element including an optical axis. The third movable part is connected to a third optical element. The first optical element, the second optical element, and the third optical element are arranged along the optical axis. The second optical element is located between the first optical element and the third optical element when viewed along a direction that is perpendicular to the optical axis.

In one of the embodiments of the present disclosure, the optical element driving mechanism further includes a fixed part. The fixed part is connected to a fourth optical element. The first optical element, the second optical element, the third optical element, and the fourth optical element are arranged along the optical axis. The first optical element is located between the second optical element and the fourth optical element when viewed along the direction that is perpendicular to the optical axis. The first movable part includes a first movable part limiting element, and the second movable part includes a second movable part limiting element. The shortest distance between the first movable part limiting element and the second movable part limiting element is shorter than the shortest distance between the first optical element and the second optical element when viewed along the direction that is perpendicular to the optical axis.

In one of the embodiments of the present disclosure, the first optical element is not in contact with the second optical element when the first movable part limiting element is in contact with the second movable part limiting element.

In one of the embodiments of the present disclosure, the fourth optical element has a fourth optical element top side and a fourth optical element bottom side opposite to the fourth optical element top side. The fourth optical element bottom side faces the first optical element. The area of the fourth optical element top side is larger than the area of the fourth optical element bottom side.

In one of the embodiments of the present disclosure, the second optical element has a second optical element top side and a second optical element bottom side opposite to the second optical element top side. The second optical element top side faces the first optical element. The area of the second optical element top side is smaller than the area of the second optical element bottom side.

In one of the embodiments of the present disclosure, the optical element driving mechanism further includes a fixed part. The fixed part includes a frame, and the movable part includes a third optical element holder. The frame accommodates the second movable part, and the third optical element holder accommodates the third optical element.

In one of the embodiments of the present disclosure, the optical element driving mechanism further includes a first supporting element. The first supporting element is located between the frame and the third optical element holder. The frame is not in direct contact with the third optical element holder.

In one of the embodiments of the present disclosure, the first supporting element is movable along a first axis that is perpendicular to the optical axis.

In one of the embodiments of the present disclosure, the fixed part further includes a bottom plate. The third optical element holder is located between the frame and the bottom plate. The third optical element holder is not in direct contact with the bottom plate.

In one of the embodiments of the present disclosure, the first supporting element is movable along a first axis that is perpendicular to the optical axis and a second axis that is perpendicular to the optical axis and the first axis.

In one of the embodiments of the present disclosure, the optical element driving mechanism further includes a second supporting element. The second supporting element is located between the third optical element holder and the bottom plate.

In one of the embodiments of the present disclosure, the second supporting element is movable along a first axis that is perpendicular to the optical axis and a second axis that is perpendicular to the optical axis and the first axis.

In one of the embodiments of the present disclosure, the optical element driving mechanism further includes a first supporting element and an elastic assembly. The frame is in contact with the elastic assembly. The first supporting element is connected to the elastic assembly, and the first supporting element is connected to the third optical element holder. The frame is not in direct contact with the third optical element holder.

In one of the embodiments of the present disclosure, the first optical element is in active alignment with the second optical element, the second optical element is m active alignment with the third optical element, and the fourth optical element is in active alignment with the second optical element.

In one of the embodiments of the present disclosure, the optical element driving mechanism further includes a fixed part. The fixed part includes an outer frame, and the outer frame includes an outer frame top surface opening. A fourth optical element top side of the fourth optical element is exposed to the outer frame top surface opening.

In one of the embodiments of the present disclosure, the optical element driving mechanism further includes a fixed part. The fixed part includes an outer frame, and the outer frame includes an outer frame sidewall opening. A first circuit element that controls the first movable part is exposed to the outer frame sidewall opening.

In one of the embodiments of the present disclosure, the optical element driving mechanism further includes a fixed part. The fixed part includes an outer frame, and the outer frame includes an outer frame sidewall recess. A third circuit element that controls the third optical element is exposed to the outer frame sidewall recess.

In one of the embodiments of the present disclosure, the optical element driving mechanism further includes a first driving assembly, and a second driving assembly. The first driving assembly drives the first optical element to control the amount of the incident light. The second driving assembly drives the second movable part to move relative to the fixed part. The fixed part has a polygonal structure when viewed along a direction that is parallel to the optical axis. The first driving assembly and the second driving assembly are located at different sides of the fixed part.

In one of the embodiments of the present disclosure, the first driving assembly includes a first driving magnetic element, and the second driving assembly includes a second driving magnetic element. The fixed part includes a first side, a second side, and a fourth side. The second side is parallel to the fourth side, and the first side is not parallel to the second side. The first driving magnetic element is disposed on the first side, and the second driving magnetic element is disposed on the second side and the fourth side.

In one of the embodiments of the present disclosure, the optical element driving mechanism further includes a third driving assembly. The third driving assembly drives the third movable part to move relative to the fixed part. The first driving assembly and the third driving assembly are located on different sides of the fixed part.

BRIEF DESCRIPTION OF THE DRAWINGS

In order to make the above and other objectives, features, and advantages of the present disclosure more obvious and understandable, preferred embodiments are listed below in conjunction with the accompanying drawings, which are described in detail as follows.

DETAILED DESCRIPTION OF THE INVENTION

The making and using of optical element driving mechanisms of embodiments of the present disclosure are discussed in detail below. It should be appreciated, however, that the embodiments provide many applicable inventive concepts that may be embodied in a wide variety of specific contexts. The specific embodiments discussed are merely illustrative of specific ways to make and use the embodiments and do not limit the scope of the disclosure.

It should be understood that, although the terms "first", "second" etc. may be used herein to describe various elements, layers and/or portions, and these elements, layers, and/or portions should not be limited by these terms. These terms are only used to distinguish one element, layer, or portion. Thus, a first element, layer or portion discussed below could be termed a second element, layer or portion without departing from the teachings of some embodiments of the present disclosure. In addition, for the sake of brevity, terms such as "first" and "second" may not be used in the description to distinguish different elements. As long as it does not depart from the scope defined by the appended claims, the first element and/or the second element described in the appended claims can be interpreted as any element that meets the description in the specification.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
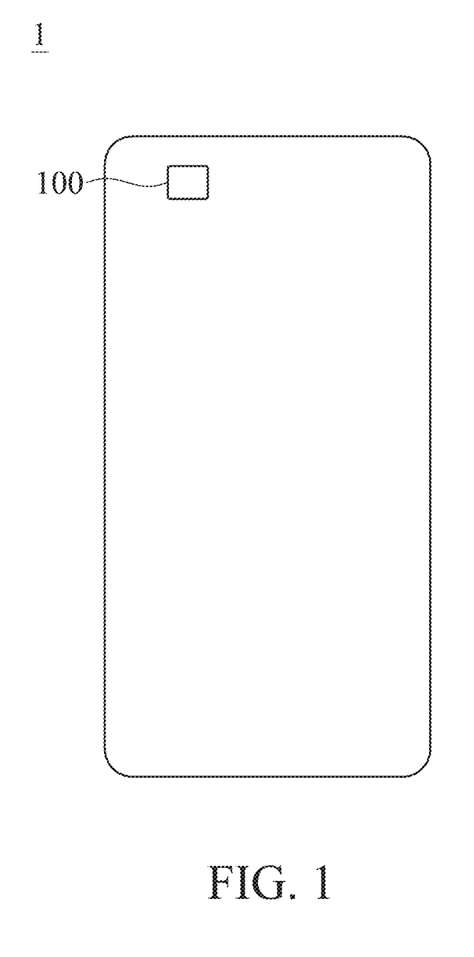
FIG. 1 is a schematic view of an electrical device according to some embodiment of the present disclosure.

Firstly, please refer to FIG. 1, FIG. 1 is a schematic view of an electrical device 1 according to some embodiment of the present disclosure. As shown in FIG. 1, an optical element driving mechanism 100 of some embodiment of the present disclosure may be mounted in an electrical device 1 for taking photos or videos, wherein the aforementioned electrical device 1 may, for example, be a smartphone or a digital camera, but the present disclosure is not limited to these. It should be noted that the position and the size between the optical element driving mechanism 100 and the electrical device 1 shown in FIG. 1 are only an example, which is not for limiting the position and the size between the optical element driving mechanism 100 and the electrical device 1. In fact, according to different needs, the optical element driving mechanism 100 may be mounted at different positions in the electrical device 1.

Figure 2:
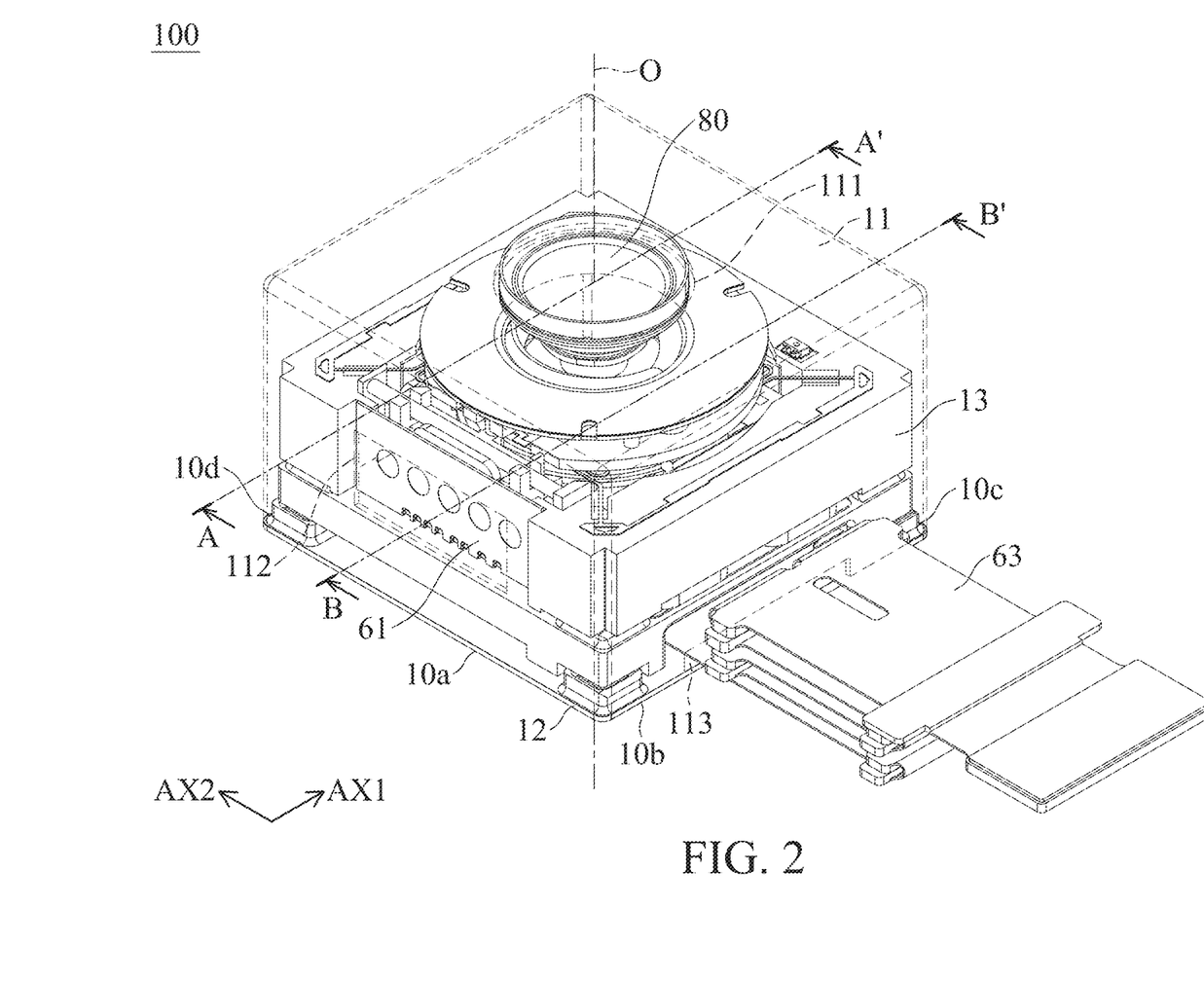
FIG. 2 is a schematic view of the optical element driving mechanism according to some embodiments of the present disclosure, wherein the outer frame is shown as a dashed line.
Figure 3:
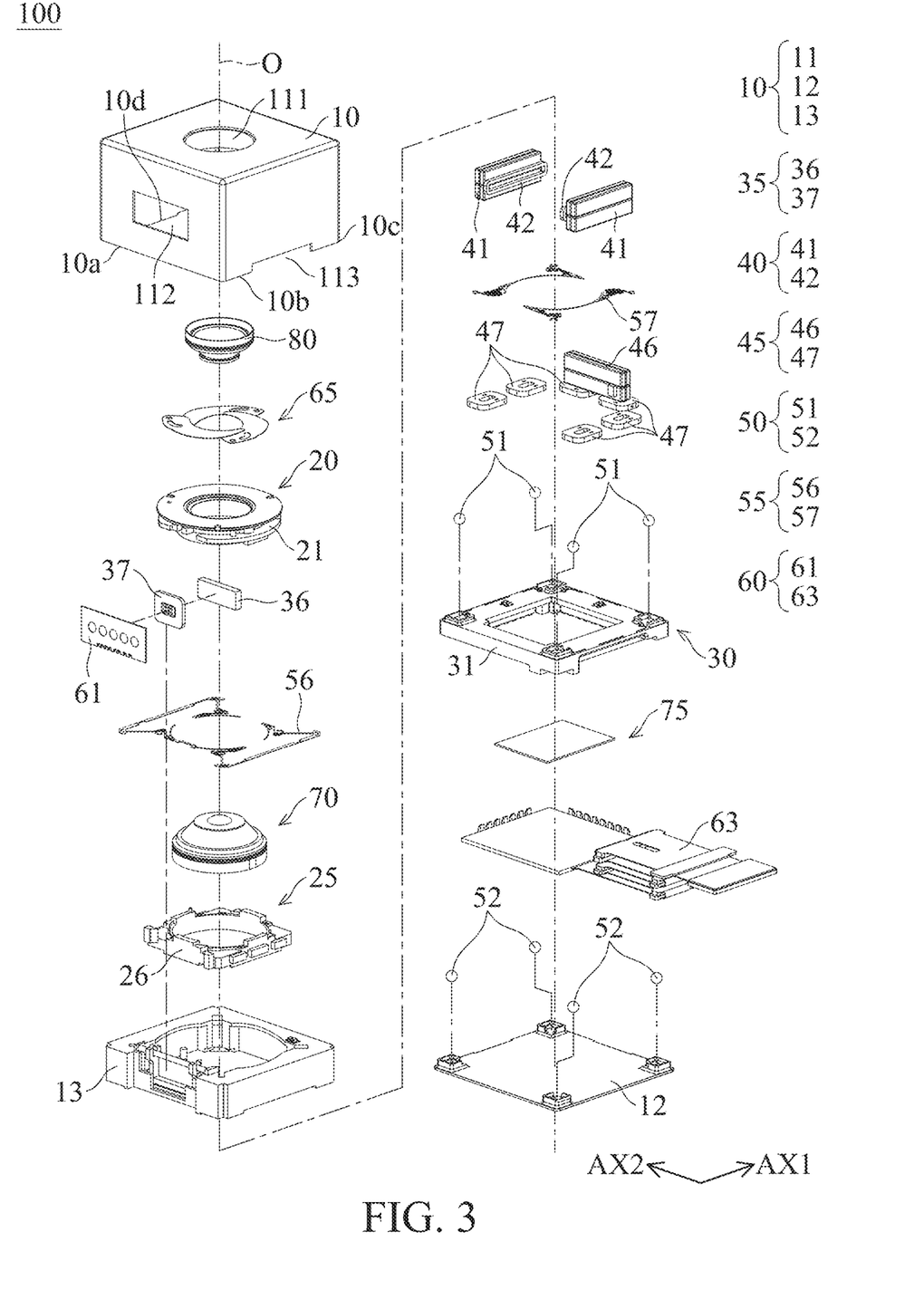
FIG. 3 is an exploded view of the optical element driving mechanism according to some embodiments of the present disclosure.

Please refer to FIG. 2. FIG. 2 is a schematic view of the optical element driving mechanism 100 according to some embodiments of the present disclosure, wherein the outer frame is shown as a dashed line. FIG. 3 is an exploded view of the optical element driving mechanism 100 according to some embodiments of the present disclosure.

As shown in FIGS. 2 and 3, the optical element driving mechanism 100 may include a fixed part 10, a first movable part 20, a second movable part 25, a third movable part 30, and a first driving assembly 35, a second driving assembly 40, a third driving assembly 45, a supporting assembly 50, an elastic assembly 55, a circuit assembly 60, a first optical element 65, a second optical element 70, a third optical element 75, and a fourth optical element 80. The second optical element 70 may have an optical axis O.

The fixed part 10 may include an outer frame 11, a bottom plate 12, and a frame 13. The outer frame 11 may be disposed on the bottom plate 12 to form an internal space. The frame 13 is disposed in the internal space. The fixed part 10 has a polygonal structure when viewed along a direction that is parallel to the optical axis O. The fixed part 10 may have a first side 10a, a second side 10b, a third side 10c, and a fourth side 10d.

According to some embodiments of the present disclosure, the first side 10a may be parallel to the third side 10c. According to some embodiments of the present disclosure, the second side 10b may be parallel to the fourth side 10d. According to some embodiments of the present disclosure, the first side 10a may not be parallel to the second side 10b and the fourth side 10d.

The outer frame 11 may include an outer frame top surface opening 111, an outer frame sidewall opening 112, and an outer frame sidewall recess 113. The outer frame top surface opening 111 is located on the top surface of the outer frame 11, and the outer frame sidewall opening 112 and the outer frame sidewall recess 113 are located on the sidewall of the outer frame.

According to some embodiments of the present disclosure, the outer frame sidewall opening 112 and the outer frame sidewall recess 113 may be located on different sides. For example, as shown in FIG. 2 and FIG. 3, the outer frame sidewall opening 112 may be located on the first side 10a of the fixed part 10, and the outer frame sidewall recess 113 may be located on the second side 10b of the fixed part 10.

In this way, it may be helpful for the electrical connection of the circuit assembly 60 to an external circuit, and the miniaturization of the optical element driving mechanism 100 may be facilitated.

The first movable part 20 may include a first optical element holder 21. The second movable part 25 may include a second optical element holder 26. The third movable part 30 may include a third optical element holder 31.

The first driving assembly 35 may include a first driving magnetic element 36 and a first driving coil 37. The second driving assembly 40 may include a second driving magnetic element 41 and a second driving coil 42. The third driving assembly 45 may include a third driving magnetic element 46 and a third driving coil 47.

According to some embodiments of the present disclosure, the first driving assembly 35 may be disposed on the first side 10a of the fixed part 10. According to some embodiments of the present disclosure, the second driving assembly 40 may be disposed on the side without the first driving assembly 35. According to some embodiments of the present disclosure, the third driving assembly 45 may be disposed on the side where the first driving assembly 35 is not provided.

Figure 4:
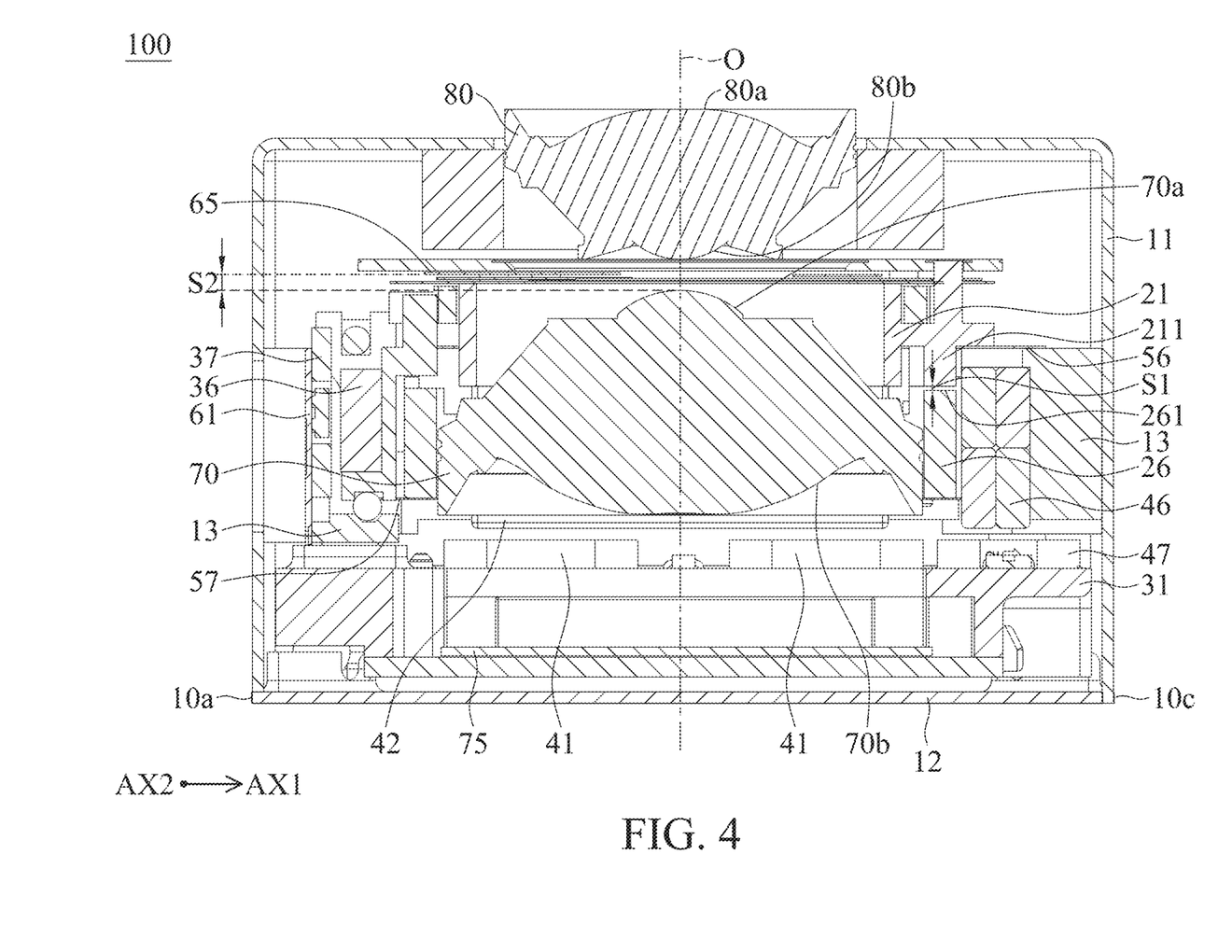
FIG. 4 is a cross-sectional view of the optical element driving mechanism along line A-A' of FIG. 2, according to some embodiments of the present disclosure.

The first driving magnetic element 36 of the first driving assembly 35 may be disposed between the first driving coil 37 and the first movable part 20 (FIG. 4).

The first driving assembly 35 and the second driving assembly 40 may be disposed on different sides of the fixed part 10. For example, according to some embodiments of the present disclosure, the second driving magnetic element 41 and the second driving coil 42 of the second driving assembly 40 may be disposed on the second side 10b and the fourth side 10d of the fixed part 10; however, the first side 10a of the fixed part 10 where the first driving magnetic element 36 and the first driving coil 37 of the first driving assembly 35 is provided is not provided with the second driving magnetic element 41 and the second driving coil 42 of the second driving assembly 40.

The first driving assembly 35 and the third driving assembly 45 may be disposed on different sides of the fixed part 10. For example, according to some embodiments of the present disclosure, the third driving magnetic element 46 and the third driving coil 47 of the third driving assembly 45 may be disposed on the second side 10b, the third side 10c, and the fourth side 10d of the fixed part 10; however, the first side 10a of the fixed part 10 where the first driving magnetic element 36 and the first driving coil 37 of the first driving assembly 35 is provided is not provided with the third driving magnetic element 46 and the third driving coil 47 of the third driving assembly 45.

With the aforementioned configuration, the interaction of the first driving assembly 35, the second driving assembly 40, and the third driving assembly 45 may be minimized, so that the control of the first driving assembly 35, the second driving assembly 40, and the third driving assembly 45 may be more precise.

According to some embodiments of the present disclosure, the third driving coil 47 may be disposed corresponding to the second driving magnetic element 41, so as to share the second driving magnetic element 41 with the second driving coil 42. In this way, it may be helpful for miniaturizing the optical element driving mechanism 100.

The supporting assembly 50 may include a first supporting element 51 and a second supporting element 52. The elastic assembly 55 may include a first elastic element 56 and a second elastic element 57. The circuit assembly 60 may include a first circuit element 61, a second circuit element (not shown), and a third circuit element 63.

The first circuit element 61 may control the first driving assembly 35 by receiving an external current, thereby controlling and driving the first movable part 20 and the first optical element 65. The second circuit element (not shown) may control the second driving assembly 40 by receiving an external current, thereby controlling and driving the second movable part 25 and the second optical element 70. The third circuit element 63 may control the third driving assembly 45 by receiving an external current, thereby controlling and driving the third movable part 30 and the third optical element 75.

As shown in FIG. 2, according to some embodiments of the present disclosure, the first circuit element 61 may be exposed to the outer frame sidewall opening 112. According to some embodiments of the present disclosure, the third circuit element 63 may be exposed to the outer frame sidewall recess 113.

In this way, it may be helpful to electrically connect the first circuit element 61 and the third circuit element 63 to an external circuit, and it may be helpful for miniaturizing the optical element driving mechanism 100.

According to some embodiments of the present disclosure, for example, the first optical element 65 may be an aperture, a shutter, or the like. According to some embodiments of the present disclosure, for example, the second optical element 70 may be a lens. According to some embodiments of the present disclosure, for example, the third optical element 75 may be a photosensitive element. According to some embodiments of the present disclosure, for example, the fourth optical element 80 may be a lens. It should be noted that the first optical element 65, the second optical element 70, the third optical element 75, and the fourth optical element 80 are not limited to the examples described herein. In fact, suitable optical elements may be selected according to requirements.

According to some embodiments of the present disclosure, the first optical element 65 is in active alignment (AA)

with the second optical element 70. According to some embodiments of the present disclosure, the second optical element 70 is in active alignment with the third optical element 75. According to some embodiments of the present disclosure, the fourth optical element 80 is in active alignment with the second optical element 70. In this way, the image quality may be stabilized, and the image quality may be improved.

The first driving assembly 35 may drive the first movable part 20 and the first optical element 65, so as to control the amount of incident light that incident to the second optical element 70. The second driving assembly 40 may drive the second movable part 25 and the second optical element 70 to move along the optical axis O relative to the fixed part 10. The third driving assembly 45 may drive the third movable part 30 to move relative to the fixed part 10 along the first axis AX1 that is perpendicular to the optical axis O and/or the second axis AX2 that is perpendicular to the optical axis O and the first axis AX1.

Please refer to FIG. 4. FIG. 4 is a cross-sectional view of the optical element driving mechanism 100 along line A-A' of FIG. 2, according to some embodiments of the present disclosure.

The first optical element holder 21 of the first movable part 20 may be connected to the first optical element 65. The second optical element holder 26 of the second movable part 25 may be connected to the second optical element 70. The third optical element holder 31 of the third movable part 30 may be connected to the third optical element 75. The outer frame 11 of the fixed part 10 may be connected to the fourth optical element 80.

As shown in FIG. 4, the first optical element 65, the second optical element 70, the third optical element 75, and the fourth optical element 80 are arranged along the optical axis O.

The first optical element 65 is located between the second optical element 70 and the fourth optical element 80 when viewed along the first axis AX1 and/or the second axis AX2 that are perpendicular to the optical axis O. The second optical element 70 is located between the first optical element 65 and the third optical element 75 when viewed along the first axis AX and/or the second axis AX2 that are perpendicular to the optical axis O.

Please continue to refer to FIG. 4, the first optical element holder 21 of the first movable part 20 may have a first movable part limiting element 211, and the second optical element holder 26 of the second movable part 25 may have a second movable part limiting element 261.

According to some embodiments of the present disclosure, the shortest distance S1 between the first movable part limiting element 211 and the second movable part limiting element 261 is shorter than the shortest distance S2 between the first optical element 65 and the second optical element 70 when viewed along the first axis AX1 and/or the second axis AX2 that are perpendicular to the optical axis O.

That is, according to some embodiments of the present disclosure, the first optical element 65 is not in contact with the second optical element 70 when the first movable part limiting element 211 is in contact with the second movable part limiting element 261. Thus, the first optical element 65 is avoided from contacting the second optical element 70, and thus the damage of the first optical element 65 and the second optical element 70 is avoided.

The elastic assembly 55 may connect the first optical element holder 21 of the first movable part 20 and the second optical element holder 26 of the second movable part 25 to the frame 13 of the fixed part 10. Specifically, the first elastic element 56 of the elastic assembly 55 may connect the first optical element holder 21 to the upper part of the frame 13, and the second elastic element 57 of the elastic assembly 55 may connect the second optical element holder 26 to the lower part of the frame 13.

Thus, the first optical element holder 21 and the second optical element holder 26 may be supported, and the second optical element holder 26 may move relative to the frame 13 along the optical axis O.

As shown in FIG. 4, the fourth optical element 80 has a fourth optical element top side 80a and a fourth optical element bottom side 80b. The fourth optical element top side 80a of the fourth optical element 80 is exposed to the outer frame top surface opening 111 of the outer frame 11 to receive light from the outside. The fourth optical element bottom side 80b is opposite to the fourth optical element top side 80a, that is, the fourth optical element top side 80a and the fourth optical element bottom side 80b face different directions.

According to some embodiments of the present disclosure, the fourth optical element bottom side 80b faces the first optical element 65. The area of the fourth optical element bottom side 80b is larger than the area of the fourth optical element bottom side 80b. In this way, the amount of the light that enters the fourth optical element 80 may be increased, and the imaging quality may be improved.

The second optical element 70 has a second optical element top side 70a and a second optical element bottom side 70b. The second optical element bottom side 70b is opposite to the second optical element top side 70a, that is, the second optical element top side 70a and the second optical element bottom side 70b face different directions.

According to some embodiments of the present disclosure, the second optical element top side 70a faces the first optical element 65. The area of the second optical element top side 70a is smaller than the area of the second optical element bottom side 70b. In this way, the second optical element 70 may effectively receive the light from the fourth optical element 80, and the imaging quality may be improved.

According to some embodiments of the present disclosure, the frame 13 accommodates the second optical element holder 26 of the second movable part 25, and the third optical element holder 31 accommodates the third optical element 75.

Figure 5:
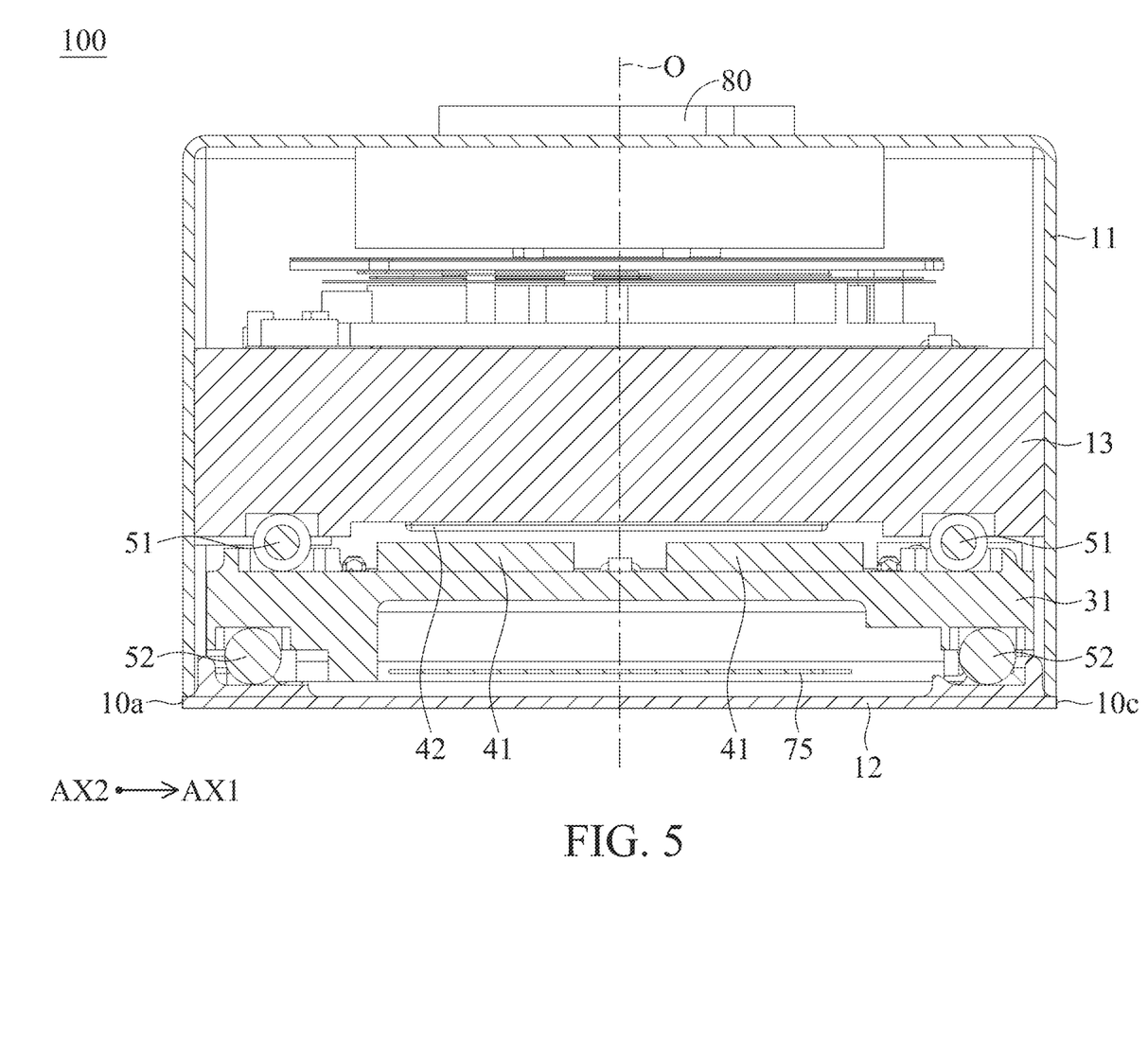
FIG. 5 is a cross-sectional view of the optical element driving mechanism along line B-B' of FIG. 2, according to some embodiments of the present disclosure.

Please refer to FIG. 5. FIG. 5 is a cross-sectional view of the optical element driving mechanism 100 along line B-B' of FIG. 2, according to some embodiments of the present disclosure.

According to some embodiments of the present disclosure, the first supporting element 51 may be a sphere. The first supporting element 51 may be located between the frame 13 and the third optical element holder 31, so that the frame 13 is not in direct contact with the third optical element holder 31. In this way, the third optical element holder 31 may move relative to the frame 13.

According to some embodiments of the present disclosure, the first supporting element 51 may move along the first axis AX1. According to some embodiments of the present disclosure, the first supporting element 51 may move along the second axis AX2. According to some embodiments of the present disclosure, the first supporting element 51 may move along the first axis AX1 and the second axis AX2.

In this way, the position of the third optical element 75 may be adjusted to improve the imaging quality.

As shown in FIG. 5, the third optical element holder 31 is located between the frame 13 and the bottom plate 12. According to some embodiments of the present disclosure, the second supporting element 52 may be a sphere. The second supporting element 52 may be located between the third optical element holder 31 and the bottom plate 12, so that the third optical element holder 31 is not in direct contact with the bottom plate 12. In this way, the third optical element holder 31 may move relative to the bottom plate 12.

According to some embodiments of the present disclosure, the second supporting element 52 may move along the first axis AX1. According to some embodiments of the present disclosure, the second supporting element 52 may move along the second axis AX2. According to some embodiments of the present disclosure, the second supporting element 52 may move along the first axis AX1 and the second axis AX2.

Figure 6:
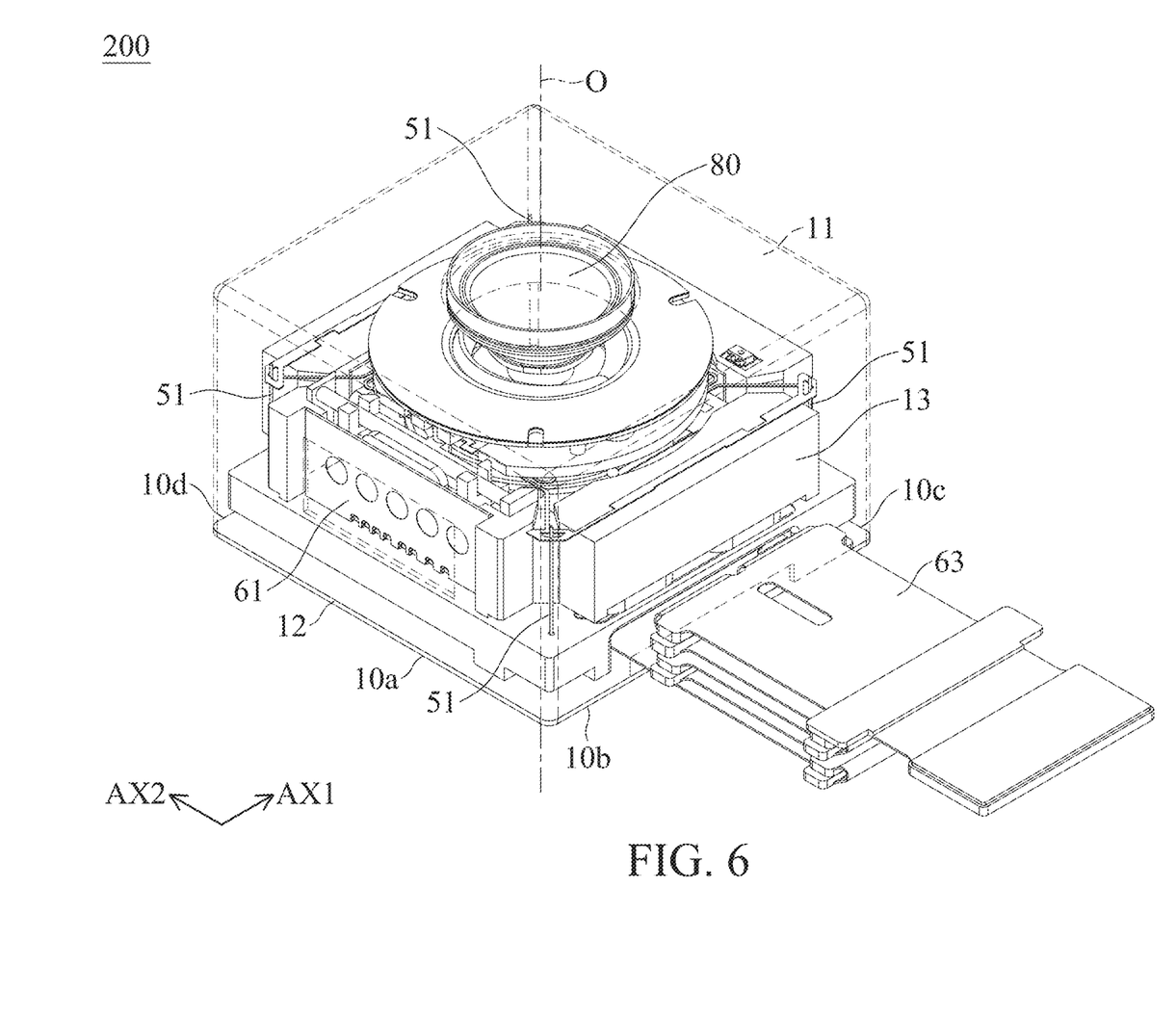
FIG. 6 is a schematic view of an optical element driving mechanism according to some embodiments of the present disclosure, wherein the outer frame is shown as a dashed line.
Figure 7:
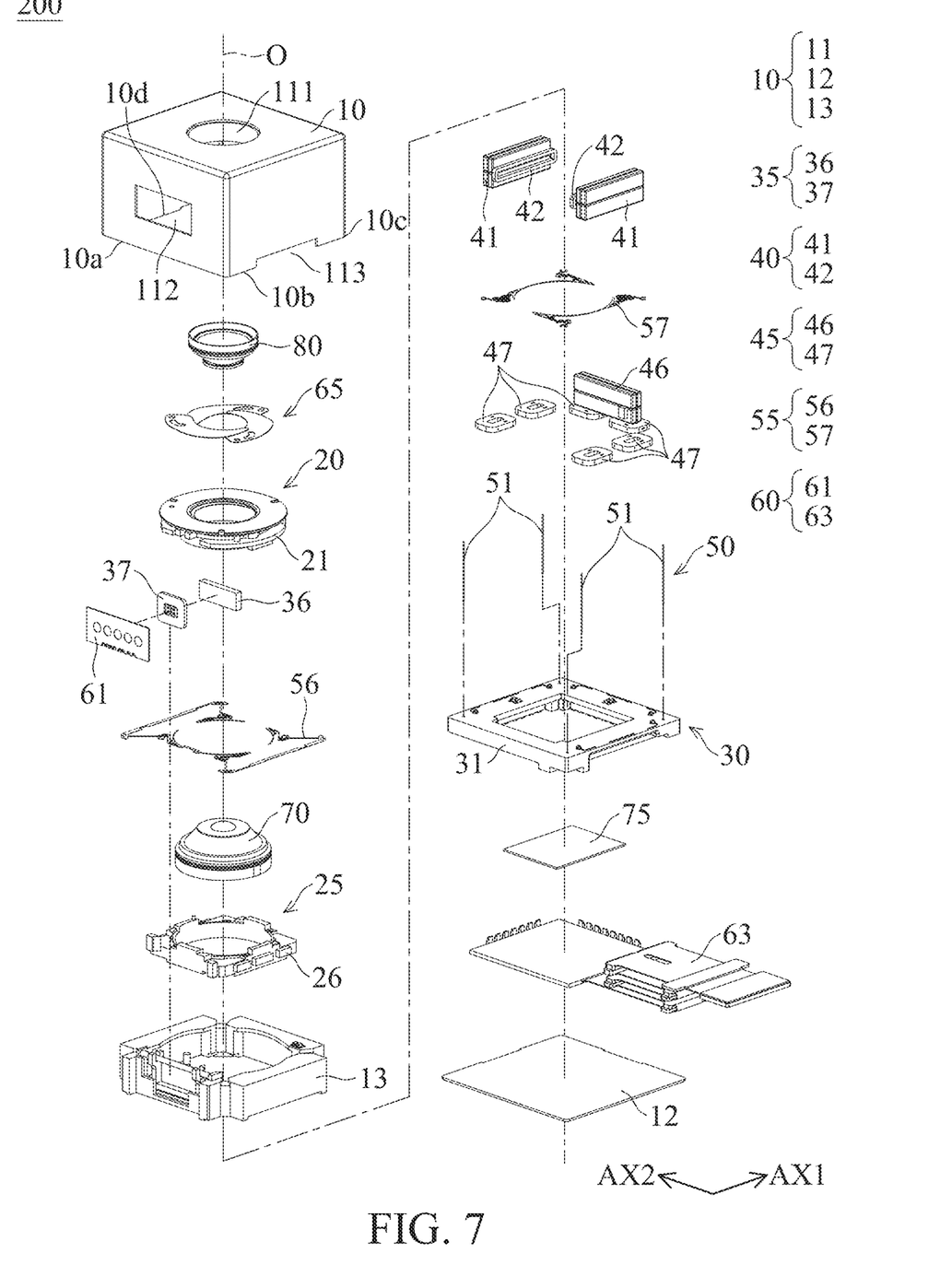
FIG. 7 is an exploded view of the optical element driving mechanism according to some embodiments of the present disclosure.

In this way, the position of the third optical element 75 may be adjusted to improve the imaging quality. niece Please refer to FIG. 6 and FIG. 7. FIG. 6 is a schematic view of an optical element driving mechanism 200 according to some embodiments of the present disclosure, wherein the outer frame is shown as a dashed line. FIG. 7 is an exploded view of the optical element driving mechanism 200 according to some embodiments of the present disclosure.

The main elements and the configuration of the optical element driving mechanism 200 is similar to that of optical element driving mechanism 100, and the similar parts will not be repeated.

As shown in FIG. 6 and FIG. 7, the main difference between the optical element driving mechanism 200 and the optical element driving mechanism 100 is that the first support member 51 of the optical element driving mechanism 200 is not spherical, and the optical element driving mechanism 200 may not have second supporting element 52.

According to some embodiments of the present disclosure, the first supporting element 51 of the supporting assembly 50 of the optical element driving mechanism 200 may be a lifting wire. The first supporting element 51 may be connected to the first elastic element 56 of the elastic assembly 55, and the first supporting element 51 may be connected to the third optical element holder 31.

In addition, according to some embodiments of the present disclosure, the supporting assembly 50 of the optical element driving mechanism 200 may no longer have the second supporting element 52. Furthermore, the frame 13 is not in direct contact with the third optical element holder 31, and the bottom plate 12 is not in direct contact with the third optical element holder 31 either.

In this way, the third optical element holder 31 may move relative to the bottom plate 12 and the frame 13 along the first axis AX1 and/or the second axis AX2, so that the position of the third optical element 75 may be adjusted to improve the imaging quality.

In general, the optical element driving mechanism of some embodiments of the present disclosure may adjust the position of the optical element along the optical axis and the directions that are perpendicular to the optical axis, and the amount of incident light that incident to the optical element driving mechanism may be adjusted to improve the imaging quality of the optical element driving mechanism. Moreover, the optical element driving mechanism of some embodiments of the present disclosure may also be helpful for the optical element driving mechanism to be electrically connected to the outside, and the effect of miniaturization may also be achieved.

Although embodiments of the present disclosure and their advantages have been described in detail, it should be understood that various changes, substitutions and alterations may be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, the scope of the present disclosure is defined by the scope of the appended claims. In addition, each scope of the claims is constructed as a separate embodiment, and various combinations of the claims and combinations of embodiments are within the scope of the present disclosure.

What is claimed is:

1. An optical element driving mechanism, comprising:
  a first movable part, connected to a first optical element;
  a second movable part, connected to a second optical element comprising an optical axis; and
  a third movable part, connected to a third optical element;
  wherein the first optical element, the second optical element, and the third optical element are arranged along the optical axis,
  wherein the second optical element is located between the first optical element and the third optical element when viewed along a direction that is perpendicular to the optical axis,
  wherein the second optical element has a second optical element top side and a second optical element bottom side opposite to the second optical element top side,
  wherein the second optical element top side faces the first optical element,
  wherein the area of the second optical element top side is smaller than the area of the second optical element bottom side.

2. The optical element driving mechanism as claimed in claim 1, further comprising a fixed part, connected to a fourth optical element,
  wherein the first optical element, the second optical element, the third optical element, and the fourth optical element are arranged along the optical axis,
  wherein the first optical element is located between the second optical element and the fourth optical element when viewed along the direction that is perpendicular to the optical axis,
  wherein the first movable part comprises a first movable part limiting element, and the second movable part comprises a second movable part limiting element, wherein the shortest distance between the first movable part limiting element and the second movable part limiting element is shorter than the shortest distance between the first optical element and the second optical element when viewed along the direction that is perpendicular to the optical axis.

3. The optical element driving mechanism as claimed in claim 2, wherein the first optical element is not in contact with the second optical element when the first movable part limiting element is in contact with the second movable part limiting element.

4. The optical element driving mechanism as claimed in claim 2, wherein the fourth optical element has a fourth optical element top side and a fourth optical element bottom side opposite to the fourth optical element top side,
   wherein the fourth optical element bottom side faces the first optical element,
   wherein the area of the fourth optical element top side is larger than the area of the fourth optical element bottom side.

5. The optical element driving mechanism as claimed in claim 2, wherein the first optical element is in active alignment with the second optical element, the second optical element is in active alignment with the third optical element, and the fourth optical element is in active alignment with the second optical element.

6. The optical element driving mechanism as claimed in claim 2, further comprising:
   a first driving assembly, driving the first optical element to control the amount of the incident light; and
   a second driving assembly, driving the second movable part to move relative to the fixed part,
   wherein the fixed part has a polygonal structure when viewed along a direction that is parallel to the optical axis,
   wherein the first driving assembly and the second driving assembly are located at different sides of the fixed part.

7. The optical element driving mechanism as claimed in claim 6, wherein the first driving assembly comprises a first driving magnetic element, and the second driving assembly comprises a second driving magnetic element,
   wherein the fixed part comprises a first side, a second side, and a fourth side,
   wherein the second side is parallel to the fourth side, and the first side is not parallel to the second side,
   wherein the first driving magnetic element is disposed on the first side, and the second driving magnetic element is disposed on the second side and the fourth side.

8. The optical element driving mechanism as claimed in claim 6, further comprising:
   a third driving assembly, driving the third movable part to move relative to the fixed part,
   wherein the first driving assembly and the third driving assembly are located on different sides of the fixed part.

9. The optical element driving mechanism as claimed in claim 1, further comprising a fixed part, wherein the fixed part comprises an outer frame, and the outer frame comprises an outer frame top surface opening,
   wherein a fourth optical element top side of the fourth optical element is exposed to the outer frame top surface opening.

10. An optical element driving mechanism, comprising:
    a first movable part, connected to a first optical element;
    a second movable part, connected to a second optical element comprising an optical axis; and
    a third movable part, connected to a third optical element;
    wherein the first optical element, the second optical element, and the third optical element are arranged along the optical axis,
    wherein the second optical element is located between the first optical element and the third optical element when viewed along a direction that is perpendicular to the optical axis,
    wherein the optical element driving mechanism further comprises a fixed part, wherein the fixed part comprises a frame, and the movable part comprises a third optical element holder,
    wherein the frame accommodates the second movable part, and the third optical element holder accommodates the third optical element.

11. The optical element driving mechanism as claimed in claim 10, further comprising a first supporting element,
    wherein the first supporting element is located between the frame and the third optical element holder,
    wherein the frame is not in direct contact with the third optical element holder.

12. The optical element driving mechanism as claimed in claim 11, wherein the first supporting element is movable along a first axis that is perpendicular to the optical axis.

13. The optical element driving mechanism as claimed in claim 11, wherein the fixed part further comprises a bottom plate,
    wherein the third optical element holder is located between the frame and the bottom plate,
    wherein the third optical element holder is not in direct contact with the bottom plate.

14. The optical element driving mechanism as claimed in claim 13, wherein the first supporting element is movable along a first axis that is perpendicular to the optical axis and a second axis that is perpendicular to the optical axis and the first axis.

15. The optical element driving mechanism as claimed in claim 13, further comprising a second supporting element,
    wherein the second supporting element is located between the third optical element holder and the bottom plate.

16. The optical element driving mechanism as claimed in claim 15, wherein the second supporting element is movable along a first axis that is perpendicular to the optical axis and a second axis that is perpendicular to the optical axis and the first axis.

17. The optical element driving mechanism as claimed in claim 10, further comprising a first supporting element and an elastic assembly,
    wherein the frame is in contact with the elastic assembly,
    wherein the first supporting element is connected to the elastic assembly, and the first supporting element is connected to the third optical element holder,
    wherein the frame is not in direct contact with the third optical element holder.

18. An optical element driving mechanism, comprising:
    a first movable part, connected to a first optical element;
    a second movable part, connected to a second optical element comprising an optical axis; and
    a third movable part, connected to a third optical element;
    wherein the first optical element, the second optical element, and the third optical element are arranged along the optical axis,
    wherein the second optical element is located between the first optical element and the third optical element when viewed along a direction that is perpendicular to the optical axis, wherein the optical element driving mechanism further comprises a fixed part, wherein the fixed part comprises an outer frame, and the outer frame comprises an outer frame sidewall opening, wherein a first circuit element that controls the first movable part is exposed to the outer frame sidewall opening.

19. An optical element driving mechanism, comprising:

a first movable part, connected to a first optical element;

a second movable part, connected to a second optical element comprising an optical axis; and a third movable part, connected to a third optical element;

wherein the first optical element, the second optical element, and the third optical element are arranged along the optical axis, wherein the second optical element is located between the first optical element and the third optical element when viewed along a direction that is perpendicular to the optical axis, wherein the optical element driving mechanism further comprises a fixed part, wherein the fixed part comprises an outer frame, and the outer frame comprises an outer frame sidewall recess, wherein a third circuit element that controls the third optical element is exposed to the outer frame sidewall recess.

\* \* \* \* \*